(12) United States Patent
Xie et al.

(10) Patent No.: US 9,219,153 B2
(45) Date of Patent: Dec. 22, 2015

(54) METHODS OF FORMING GATE STRUCTURES FOR FINFET DEVICES AND THE RESULTING SEMICONDUCTOR PRODUCTS

(71) Applicants: GLOBALFOUNDRIES Inc., Grand Cayman (KY); International Business Machines Corporation, Armonk, NY (US)

(72) Inventors: Ruilong Xie, Niskayuna, NY (US); Shom Ponoth, Gaithersburg, MD (US); Juntao Li, Cohoes, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 6 days.

(21) Appl. No.: 13/972,348

(22) Filed: Aug. 21, 2013

(65) Prior Publication Data

US 2015/0054078 A1      Feb. 26, 2015

(51) Int. Cl.
| | |
|---|---|
| *H01L 21/336* | (2006.01) |
| *H01L 29/78* | (2006.01) |
| *H01L 21/28* | (2006.01) |
| *H01L 21/8238* | (2006.01) |
| *H01L 21/84* | (2006.01) |
| *H01L 29/66* | (2006.01) |
| *H01L 27/092* | (2006.01) |
| *H01L 27/12* | (2006.01) |

(52) U.S. Cl.
CPC ........ *H01L 29/785* (2013.01); *H01L 21/28008* (2013.01); *H01L 21/823821* (2013.01); *H01L 21/845* (2013.01); *H01L 27/0924* (2013.01); *H01L 27/1211* (2013.01); *H01L 29/66545* (2013.01)

(58) Field of Classification Search
CPC .............. H01L 29/785; H01L 29/6681; H01L 29/66613
USPC .................. 438/197, 585, 589, 221, 222, 269
See application file for complete search history.

(56) References Cited

U.S. PATENT DOCUMENTS

| | | | |
|---|---|---|---|
| 8,273,626 B2* | 9/2012 | Hareland et al. | 438/283 |
| 8,900,941 B2* | 12/2014 | Cai et al. | 438/197 |
| 8,946,782 B2* | 2/2015 | Chang et al. | 257/213 |
| 8,981,481 B2* | 3/2015 | Hafez et al. | 257/351 |
| 2013/0099295 A1* | 4/2013 | Baars et al. | 257/288 |
| 2013/0277758 A1* | 10/2013 | Chang et al. | 257/390 |
| 2013/0292805 A1* | 11/2013 | Cai et al. | 257/622 |
| 2013/0341704 A1* | 12/2013 | Rachmady et al. | 257/327 |
| 2014/0001569 A1* | 1/2014 | Hafez et al. | 257/392 |
| 2014/0001575 A1* | 1/2014 | Adams et al. | 257/412 |
| 2014/0015055 A1* | 1/2014 | Flachowsky et al. | 257/368 |

\* cited by examiner

*Primary Examiner* — Earl Taylor
(74) *Attorney, Agent, or Firm* — Amerson Law Firm, PLLC

(57) ABSTRACT

One method disclosed herein includes forming a stack of material layers to form gate structures, performing a first etching process to define an opening through the stack of materials that defines an end surface of the gate structures, forming a gate separation structure in the opening and performing a second etching process to define side surfaces of the gate structures. A device disclosed herein includes first and second active regions that include at least one fin, first and second gate structures, wherein each of the gate structures have end surfaces, and a gate separation structure positioned between the gate structures, wherein opposing surfaces of the gate separation structure abut the end surfaces of the gate structures, and wherein an upper surface of the gate separation structure is positioned above an upper surface of the at least one fin.

20 Claims, 19 Drawing Sheets

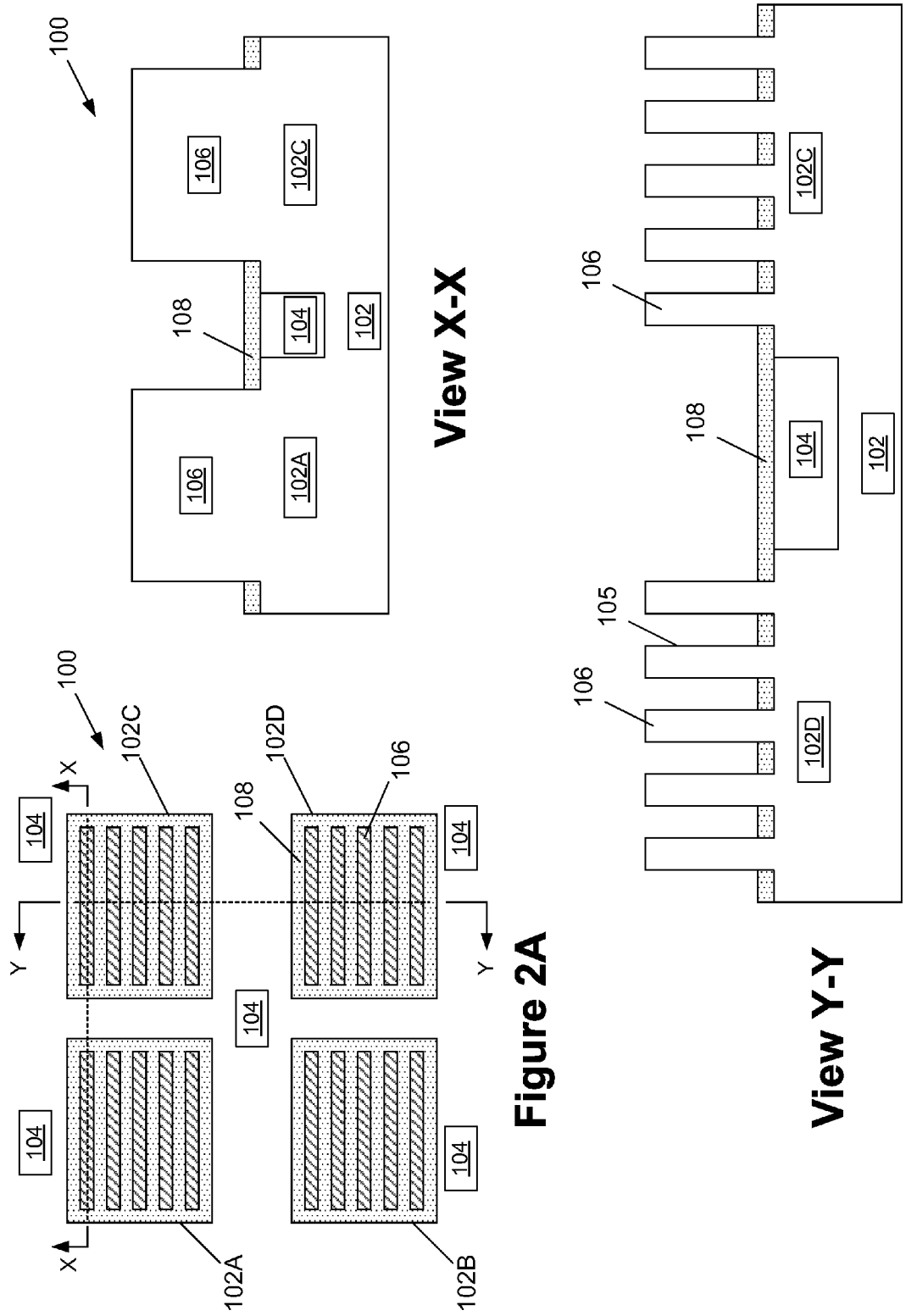

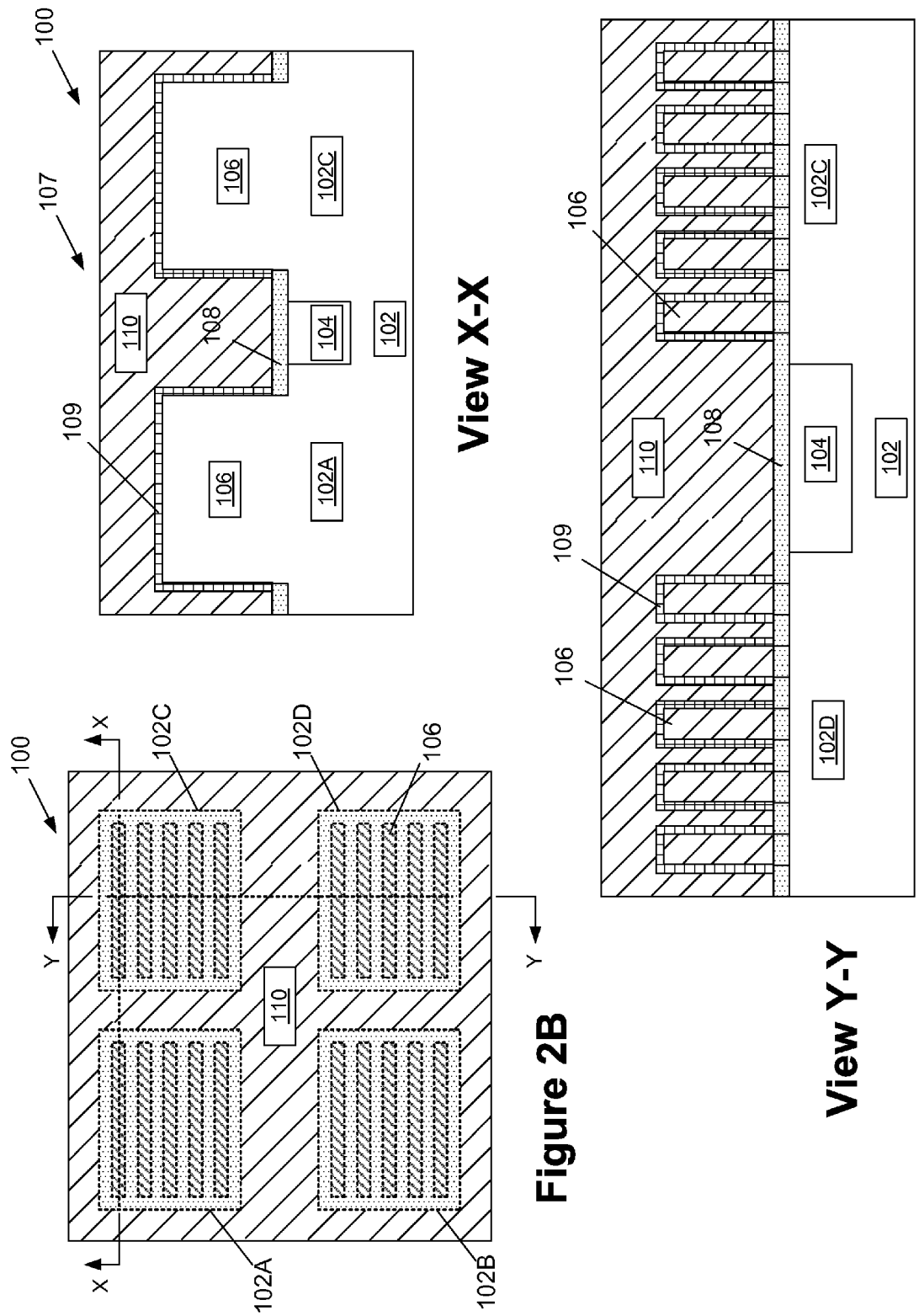

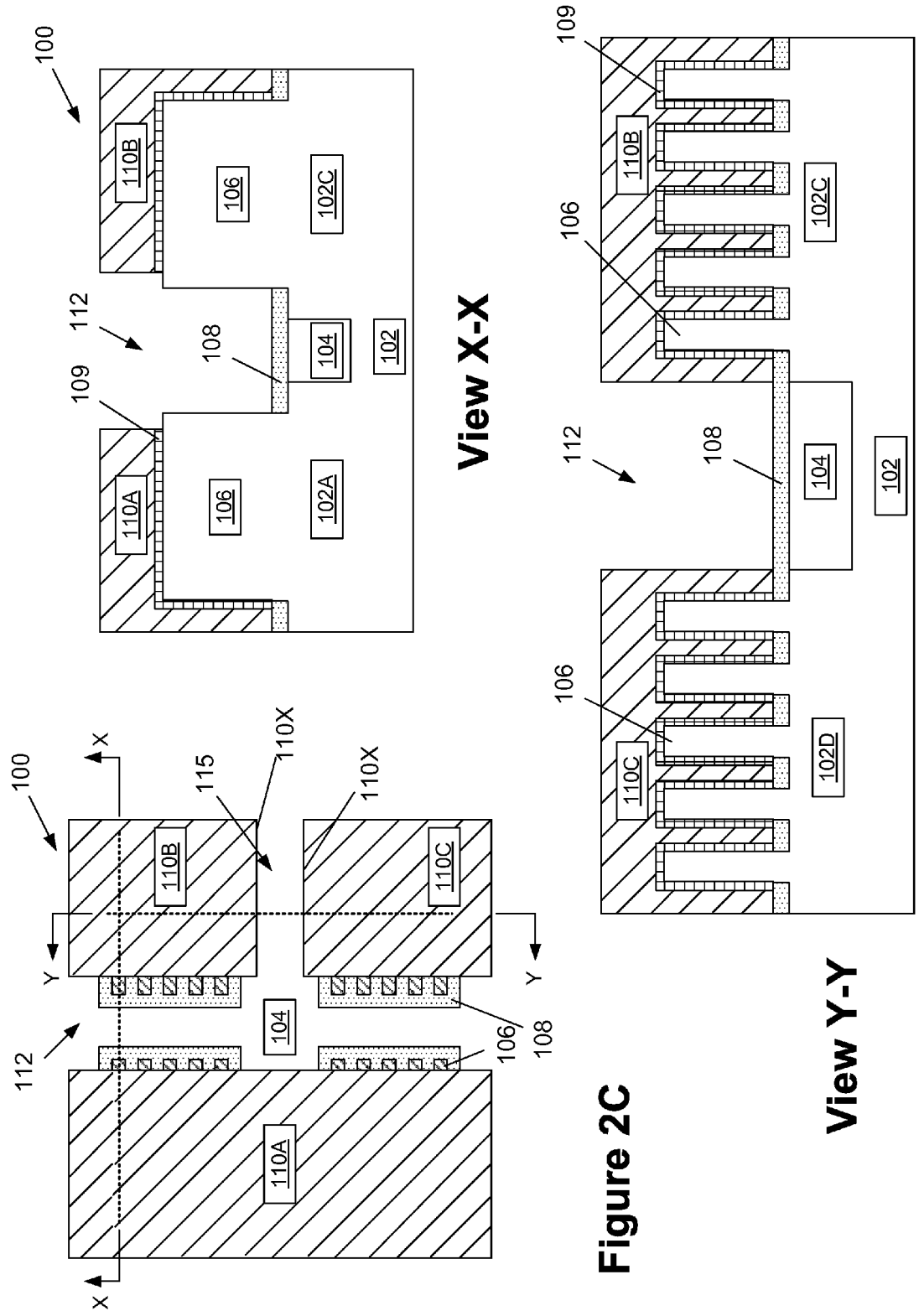

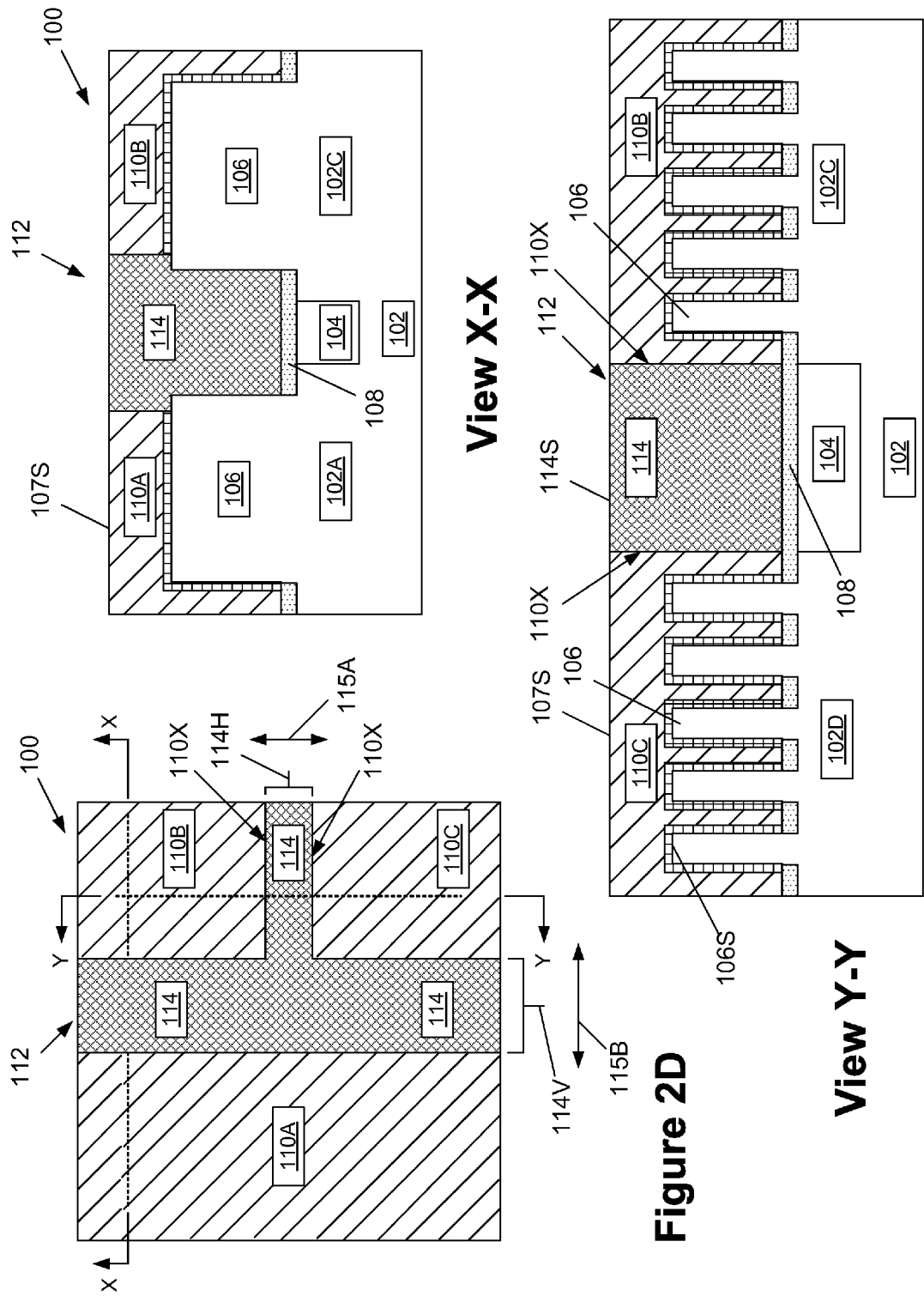

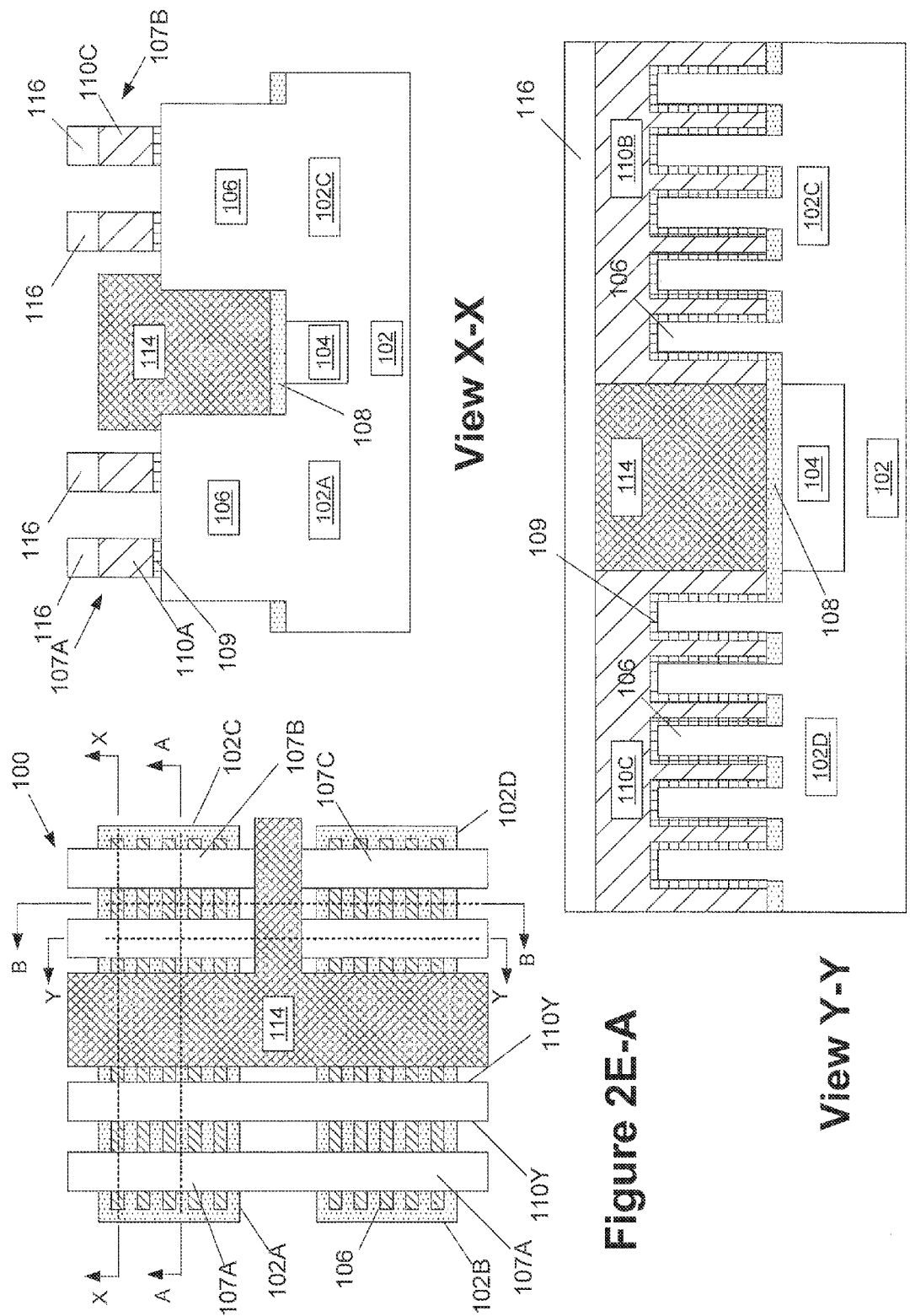

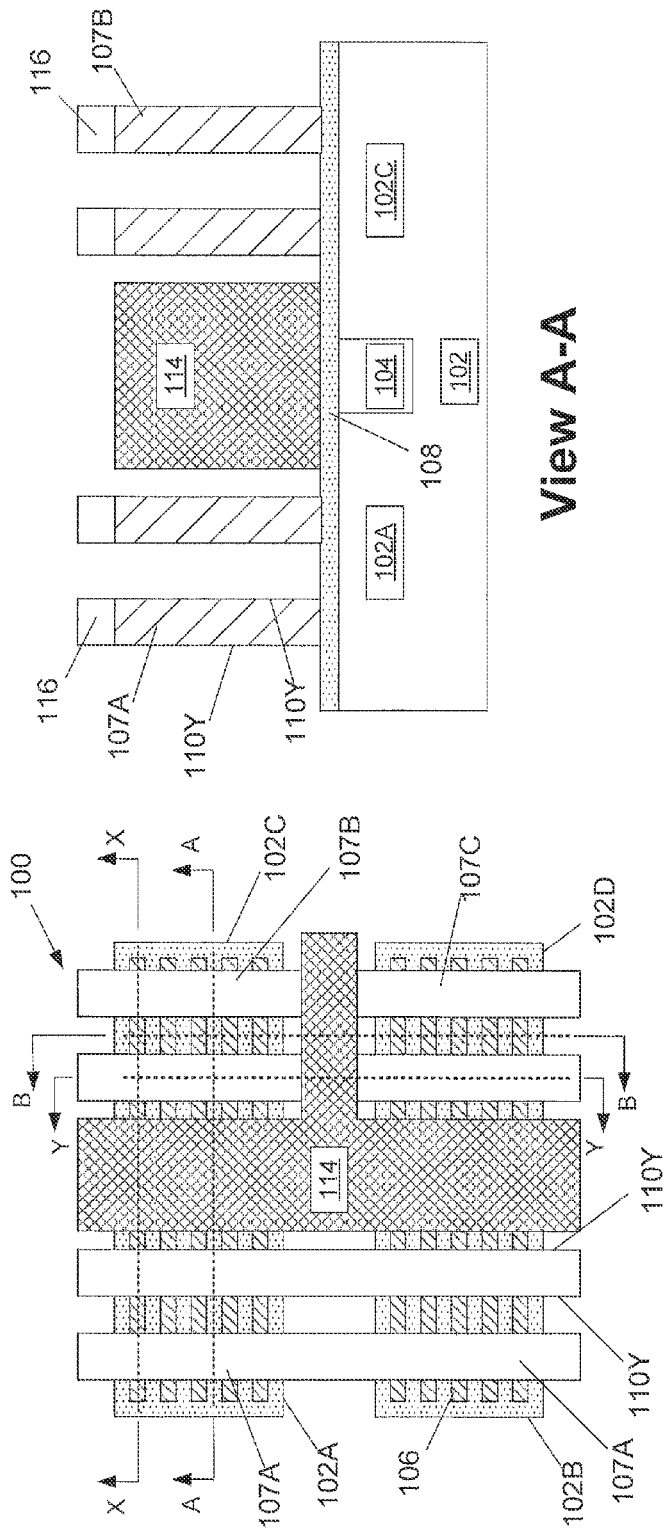
Figure 2E-B

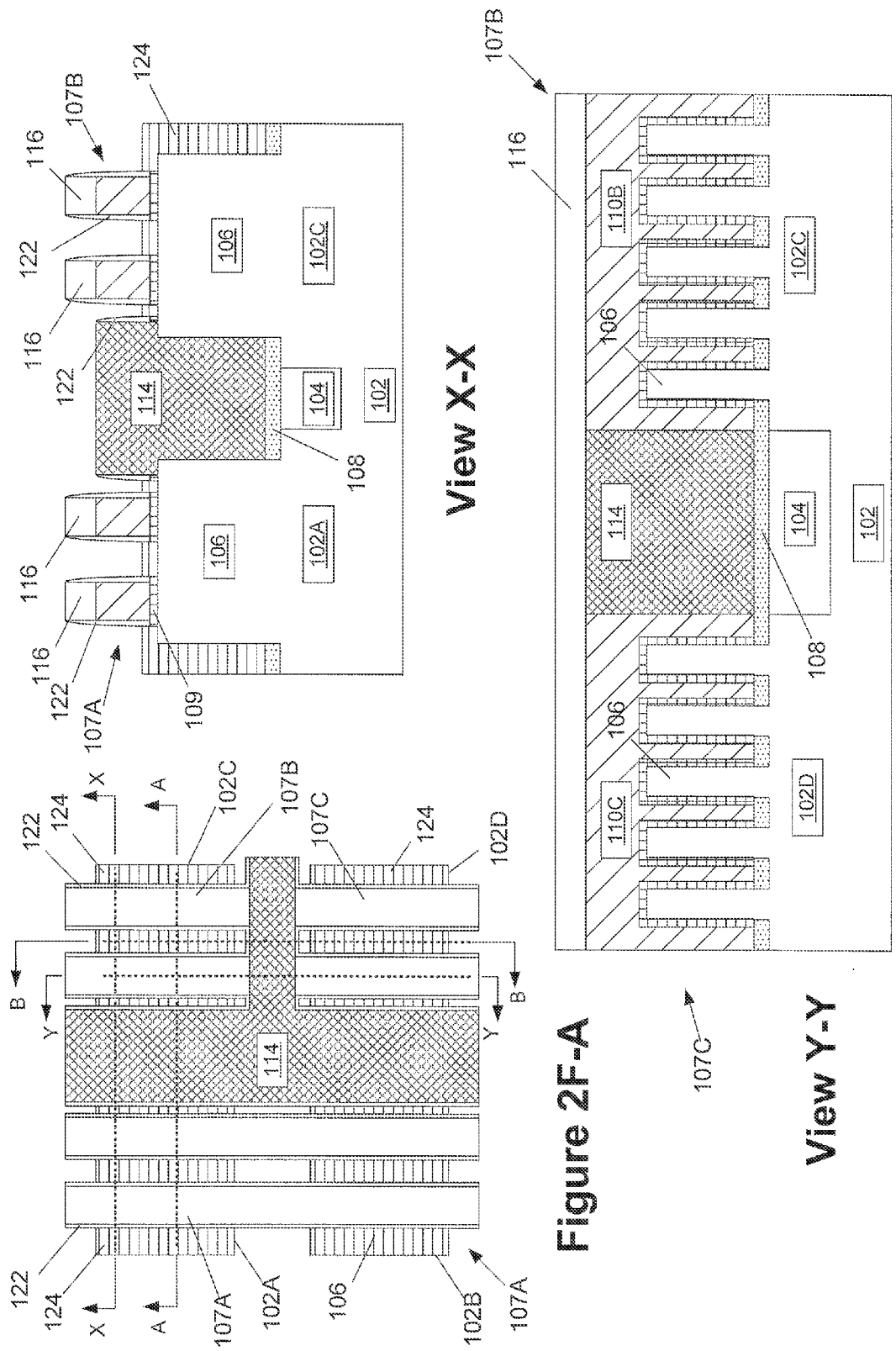
Figure 2F-A

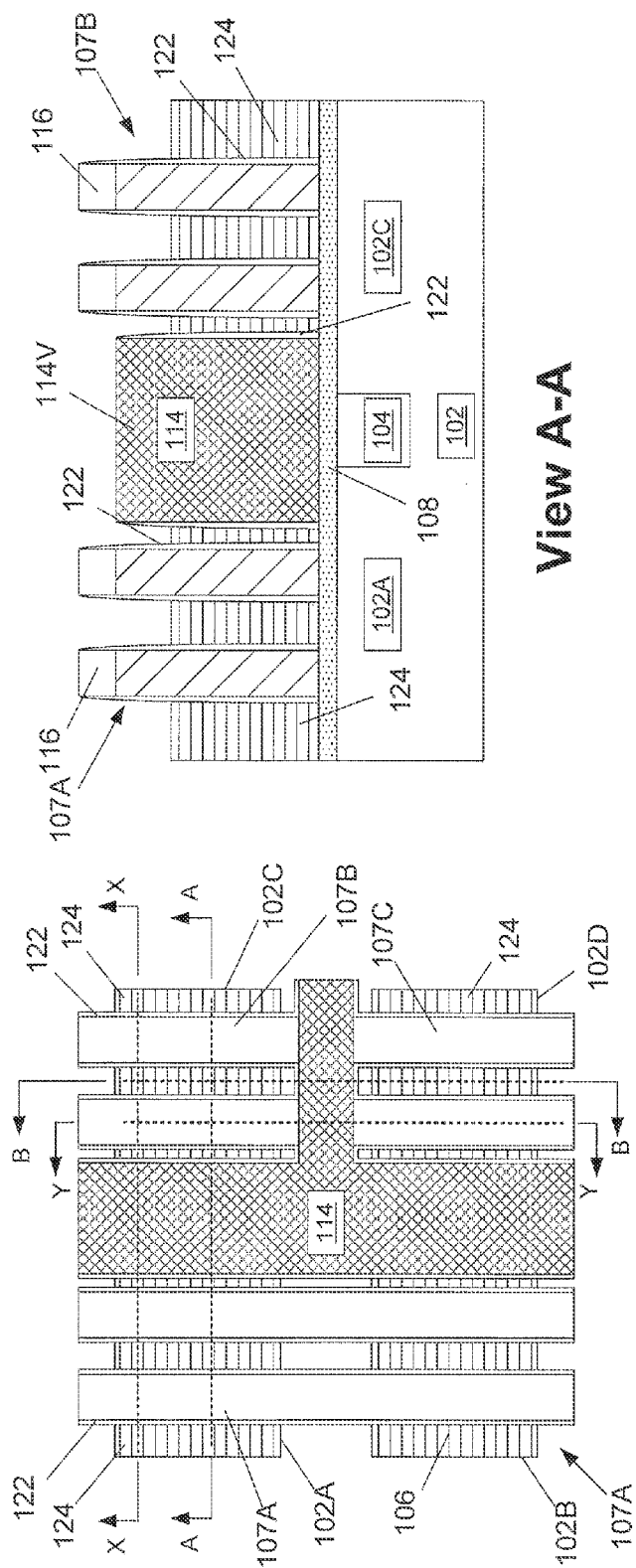
Figure 2F-B
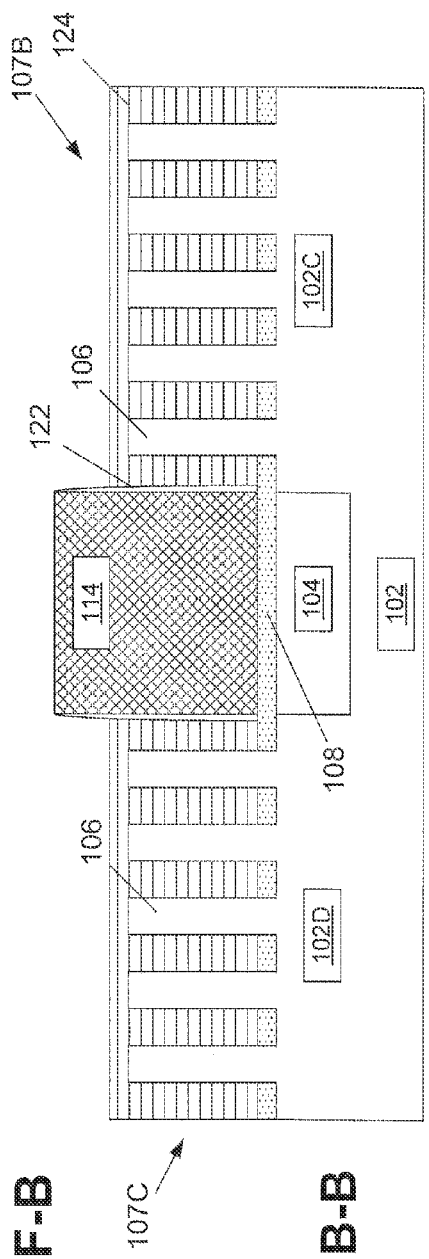
View A-A
View B-B

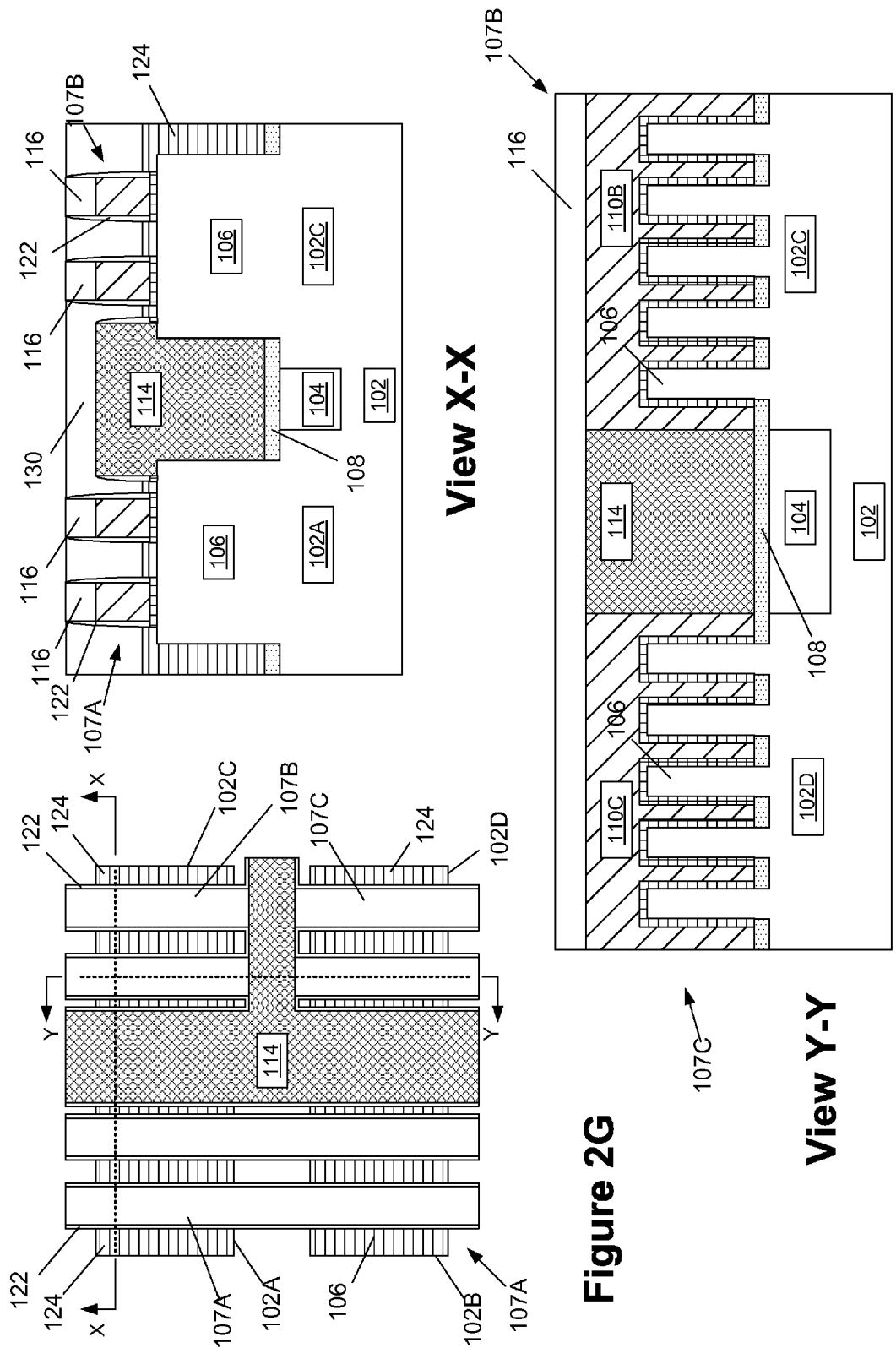

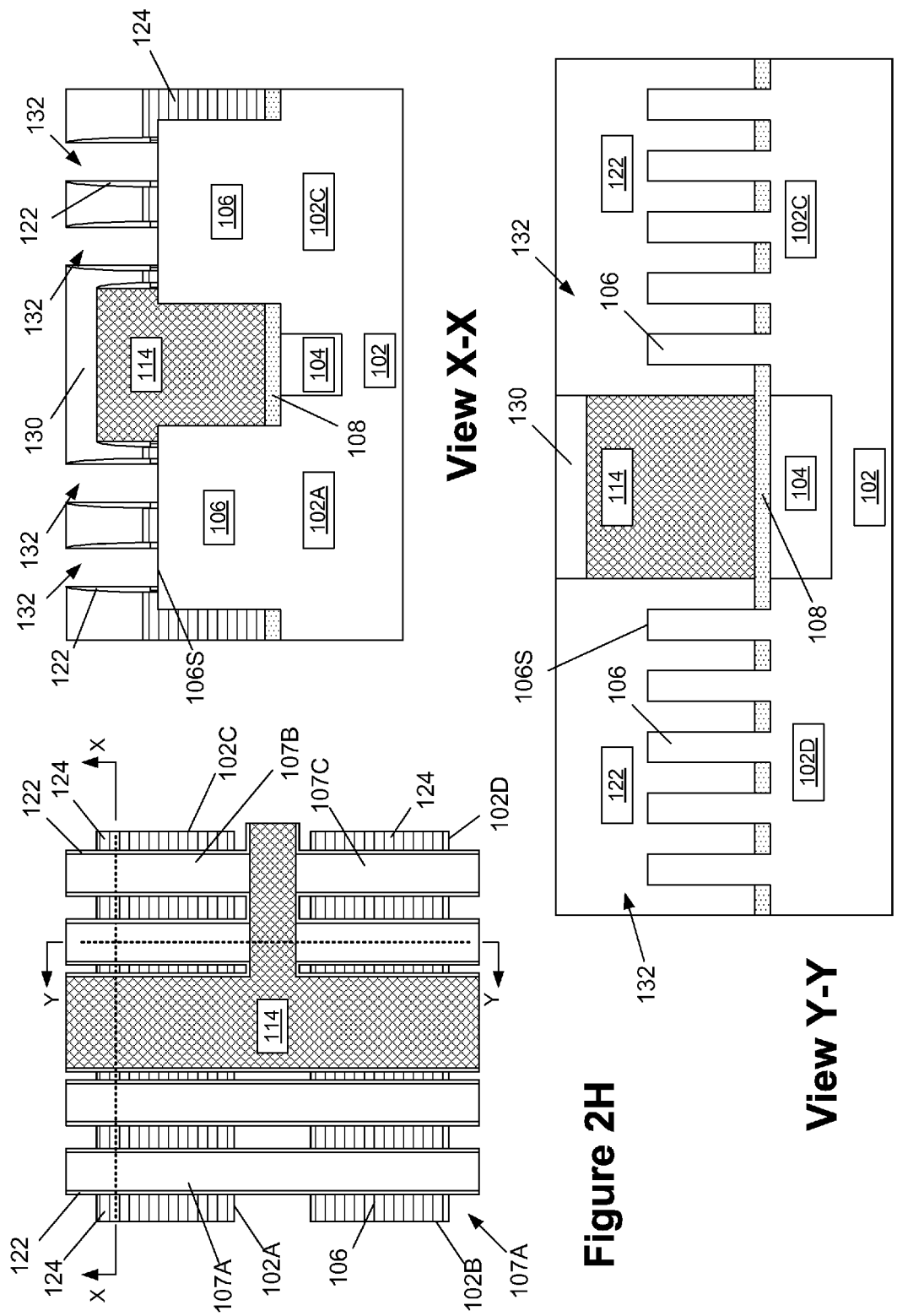

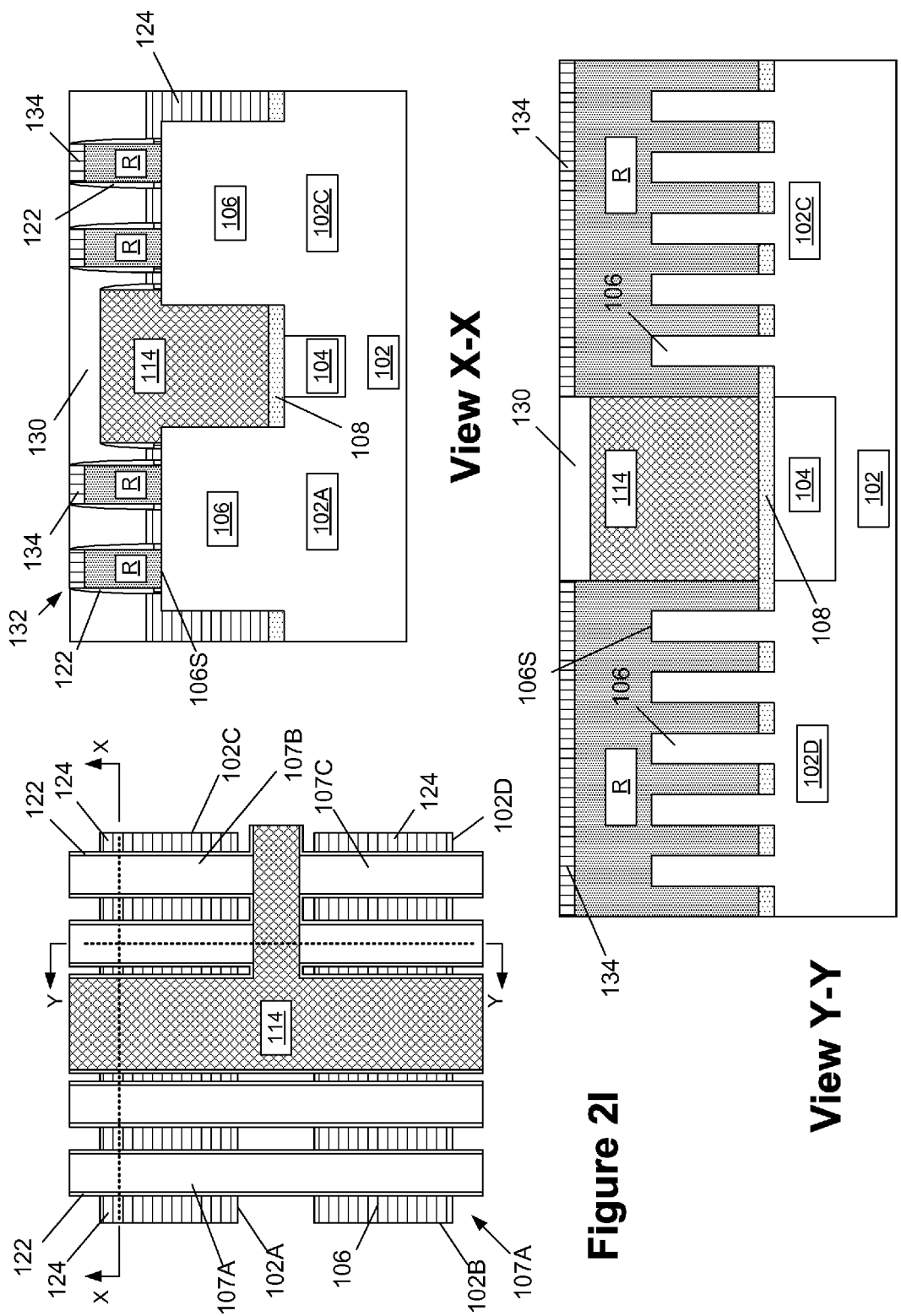

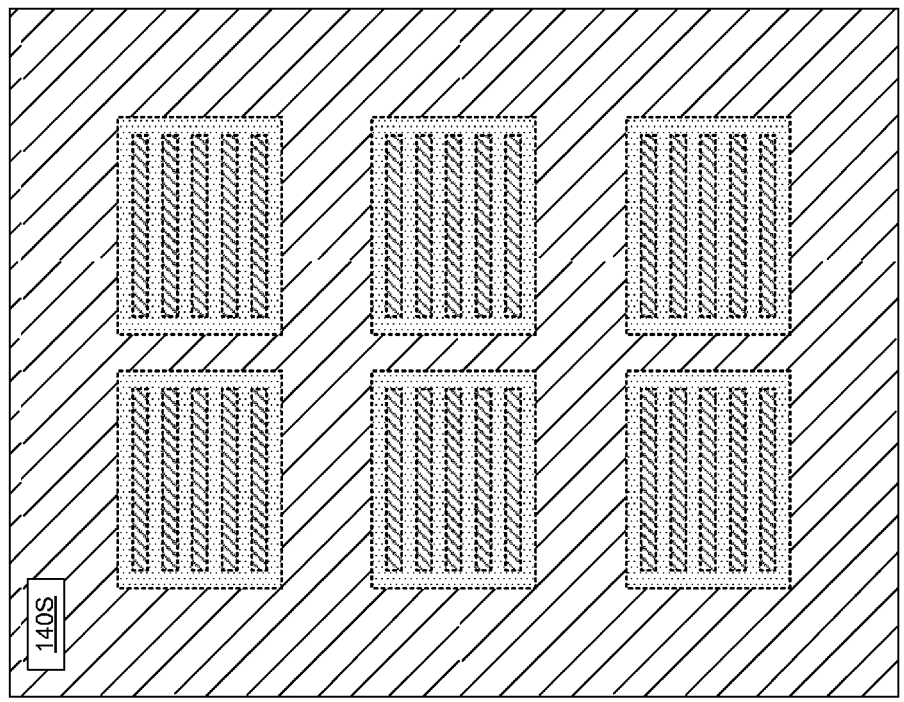
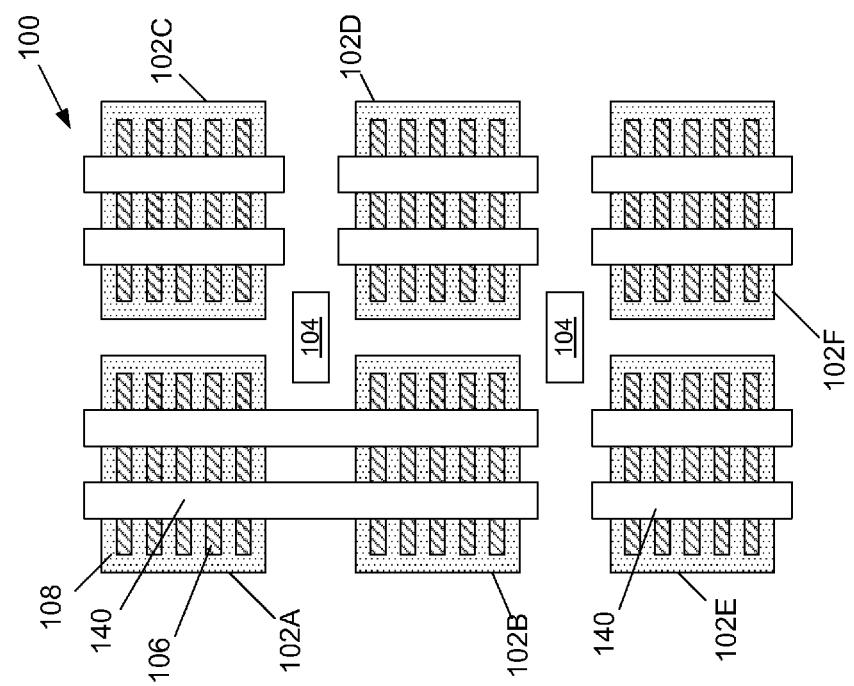
Figure 2J
Figure 2K

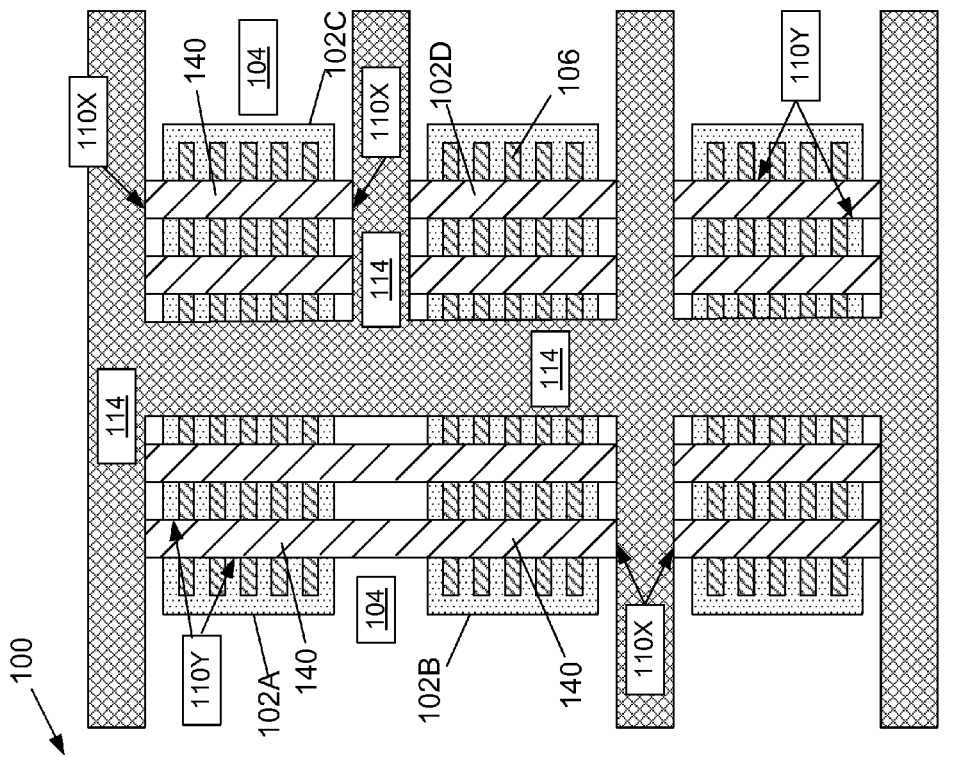
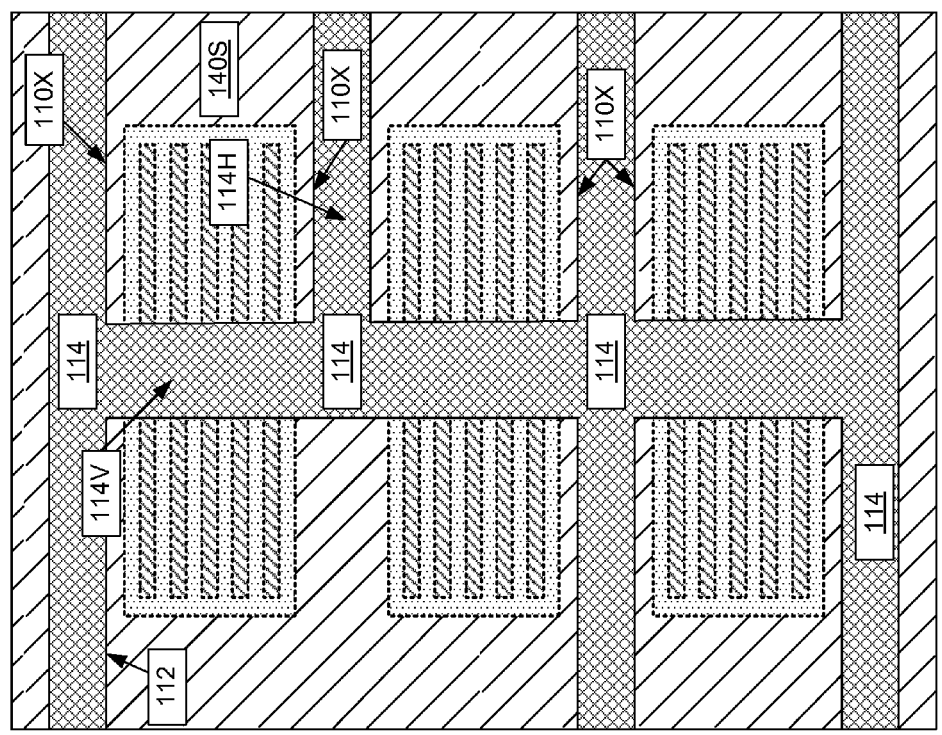
Figure 2O
Figure 2N

US 9,219,153 B2

METHODS OF FORMING GATE STRUCTURES FOR FINFET DEVICES AND THE RESULTING SEMICONDUCTOR PRODUCTS

BACKGROUND OF THE INVENTION

1. Field of the Invention

The present disclosure generally relates to the fabrication of integrated circuits, and, more particularly, to various methods of forming gate structures for FinFET devices and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

Over recent years, due to the reduced dimensions of the transistor devices, the operating speed of the circuit components has been increased with every new device generation, and the "packing density," i.e., the number of transistor devices per unit area, in such products has also increased during that time. As a result of such increased packing densities, the physical space between adjacent devices has become very small, which can lead to some problems in manufacturing. FIGS. 1B-1E are plan views that depict the manufacture of eight separate FinFET devices above four separated active regions so as to explain one current problem encountered when attempting to manufacture FinFET devices in applications requiring very high packing densities.

FIG. 1B is a plan view of an illustrative prior art integrated circuit product 10 at an advanced stage of fabrication. In general, the product 10 is comprised of eight illustrative Fin- FET devices 11A-11H, wherein two of each of the FinFET devices are above each of four spaced-apart active regions 12A-12D that are defined in a semiconductor substrate by regions 18 of an isolation material, such as trenches filled with silicon dioxide. In the depicted example, the FinFET devices 11A-11H share a common source or drain region, see, e.g., the FinFET devices 11A, 11B wherein they each have separate drain regions (DR) but a common source region (SR). In this particular example, each of the FinFET devices 11A-11H is comprised of five illustrative fins 14 and an illustrative gate structure 16. A layer of insulating material 13 would have been formed between the fins 14 on active regions 12A-12D so as to locally isolate the fins 14 from one another. At this point in the process flow, the gate structures 16 would include sidewall spacers and a cap layer (each of which are not separately shown) so as to encapsulate and protect the gate electrode and gate insulation materials. In this particular example, the FinFET devices 11A-11D formed above the active regions 12A-12B share common gate electrodes, while the FinFET devices 11E-11H formed above the active regions 12C-12D are depicted as having separate gate electrode structures 16. The gate electrodes for the FinFET devices are typically formed by patterning one or more layers of material, i.e., the gate stack materials, to define long parallel line-type structures, i.e., gate electrode structures that extend across multiple active regions and multiple isolation regions. These long, line-type gate electrode structures are initially patterned so as to have the desired critical dimension (i.e., the dimension of gate electrode corresponding to the gate length of the finished device). That is, the sides 16Y of the line-type gate electrode structures 16 are patterned first. At some point later in the process flow, these long, line-type gate electrode structures are subsequently "cut" by performing an etching process to define the final gate electrodes. That is, the ends 16X of the line-type gate electrode structures 16 are patterned last so as to thereby define the final gate electrodes. The region 15 in FIG. 1B depicts the cuts made in the gate structures 16 formed above the active regions 12C-12D.

FIG. 1C depicts the product 100 after a selective epitaxial deposition process, i.e., a fin "merger" process, has been performed to form an epi semiconductor material 20 on the exposed portions of the fins 14. For reference purposes, the fins 14 formed above the active region 12A are depicted in dashed lines in FIG. 1C.

FIG. 1D depicts the product 100 after conductive contact structures 22 have been formed so as to establish electrical connection to the merged source/drain regions of the FinFET devices 11A-11H. The contact structures 22 would have been formed in contact openings formed in a previously formed layer of insulating material (not shown) that was formed above the source/drain regions. The contact structures 22 may be formed from a variety of materials, e.g., tungsten. In some cases, the contact structures 22 are referred to as "trench-silicide" structures due to the fact that they may be formed in trench-type openings and a metal silicide is formed where the contact 22 engages the epi semiconductor material 20.

FIG. 1E is an enlarged view of a portion of the product 100 shown in FIG. 1D. In general, the ends 16X of the gate structures 16 must be designed such that they extend a distance 16D beyond the edge of the active regions so as to prevent undesirable "bridging" of the epi material 20, as reflected by the dashed arrow 30. To the extent such bridging occurs, then device failure may occur due to the presence of a short between the source/drain regions of the FinFET device. In one example, using current day technology, the distance 16D (spacing between the end of electrode 16 and the sidewall of fin 14) may be on the order of about 30-50 nm, while the end-to-end spacing 16R between electrodes 16 may be on the order of about 30-50 nm. One solution to remedy the potential for bridging of the epi material formed on the fins 14 would be to simply make the distance 16D large enough so that there is little, if any, potential form the undesirable bridging of the epi material. However, such a "solution" would lead to reduced packing densities, which is counter to the ongoing trend in the industry now and for the foreseeable future.

The present disclosure is directed to various methods of forming gate structures for FinFET devices and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to methods of forming gate structures for FinFET devices and the resulting semiconductor devices. One method disclosed includes, among other things, forming a stack of material layers to form a plurality of gate structures above a semiconductor substrate, performing at least one first etching process through a first patterned etch mask on the stack of material layers to define at least one opening therethrough, wherein the at least one opening defines an end surface of the plurality of gate structures, removing the first patterned etch mask, forming a gate separation structure in the at last one opening and, with the gate separation structure in position in the at least one opening, performing at least one second etching process through a second patterned etch mask on the stack of material layers to define side surfaces of the plurality of gate structures.

Another illustrative method disclosed herein includes, among other things, forming a stack of material layers to form a plurality of gate structures above a plurality of spaced-apart active regions defined in a semiconductor substrate, wherein each of the active regions have at least one fin formed thereabove, performing at least one first etching process through a first patterned etch mask on the stack of material layers to define at least one opening therethrough, wherein the at least one opening defines an end surface of the plurality of gate structures, removing the first patterned etch mask, forming a gate separation structure in the at least one opening, wherein the gate separation structure is formed such that it abuts the end surfaces, and, with the gate separation structure in position in the at least one opening, performing at least one second etching process through a second patterned etch mask on the stack of material layers to define side surfaces of the plurality of gate structures.

One illustrative device disclosed herein includes, among other things, first and second spaced-apart active regions formed in a semiconductor substrate, wherein each of the active regions includes at least one fin, first and second spaced-apart gate structures positioned above the first and second active regions, respectively, wherein each of the gate structures has an end surface, and a gate separation structure positioned between the first and second spaced-apart gate structures, wherein first and second opposing surfaces of the gate separation structure abut the end surfaces of first and second spaced-apart gate structures, respectively, and wherein an upper surface of the gate separation structure is positioned above an upper surface of the at least one fin.

Yet another illustrative device disclosed herein includes, among other things, first and second spaced-apart active regions formed in a semiconductor substrate, wherein the active regions include at least one fin, first and second spaced-apart gate structures positioned above the first and second active regions, respectively, each of the gate structures being oriented substantially parallel to one another, wherein each of the first and second gate structures comprises side surfaces, and a gate separation structure positioned in an area between the side surfaces of the first and second spaced-apart gate structures, wherein an upper surface of the gate separation structure is positioned above an upper surface of the at least one fin.

BRIEF DESCRIPTION OF THE DRAWINGS

The disclosure may be understood by reference to the following description taken in conjunction with the accompanying drawings, in which like reference numerals identify like elements, and in which.

Figure 1A:
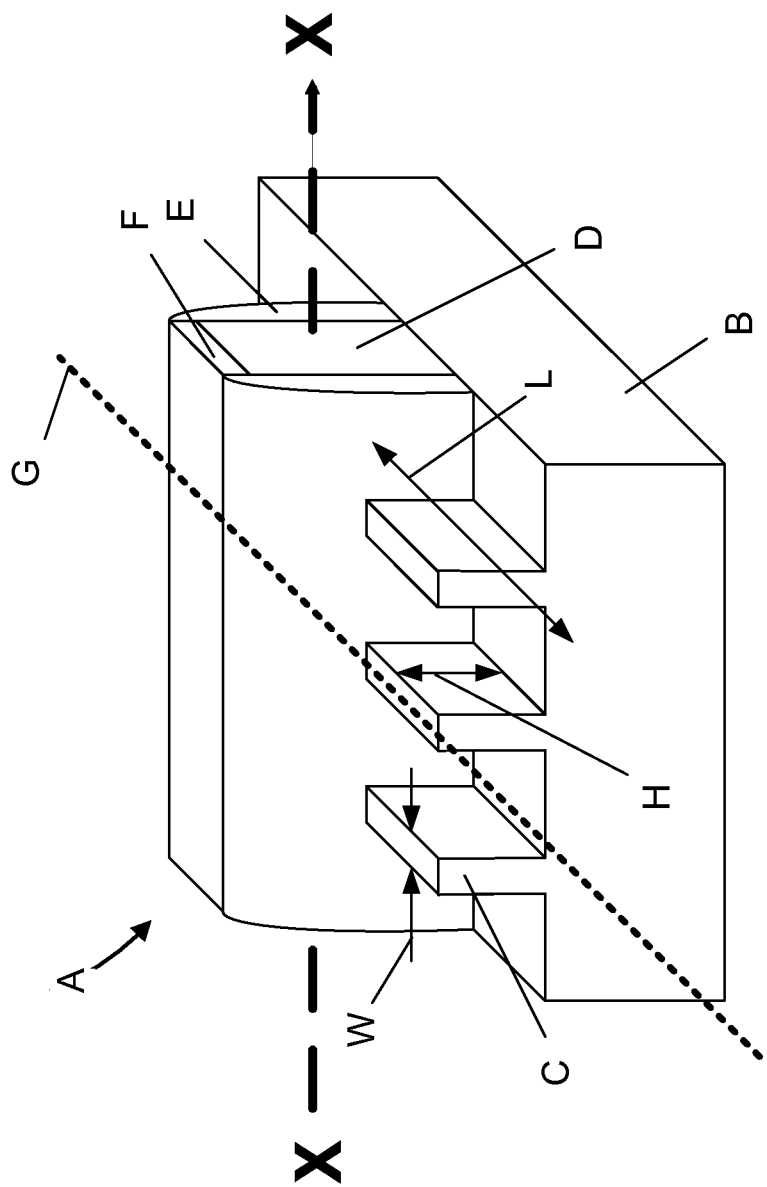
FIG. 1A is a perspective view of an illustrative prior art FinFET semiconductor device.
Figure 1B:
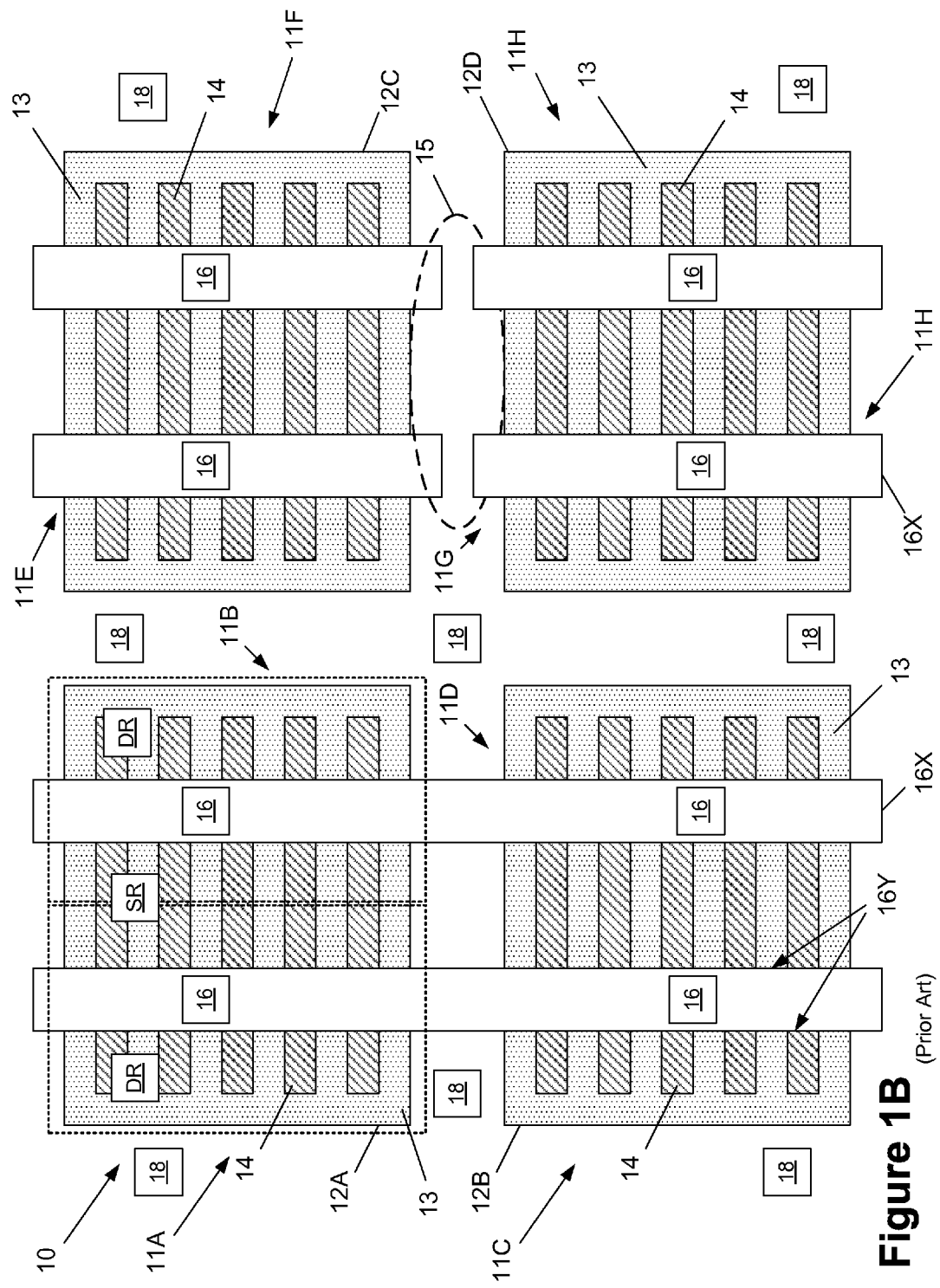
FIGS. 1B-1E are plan views simplistically depicting one illustrative prior art fabrication sequence for forming metal silicide regions on a prior art FinFET device.
Figure 1C:
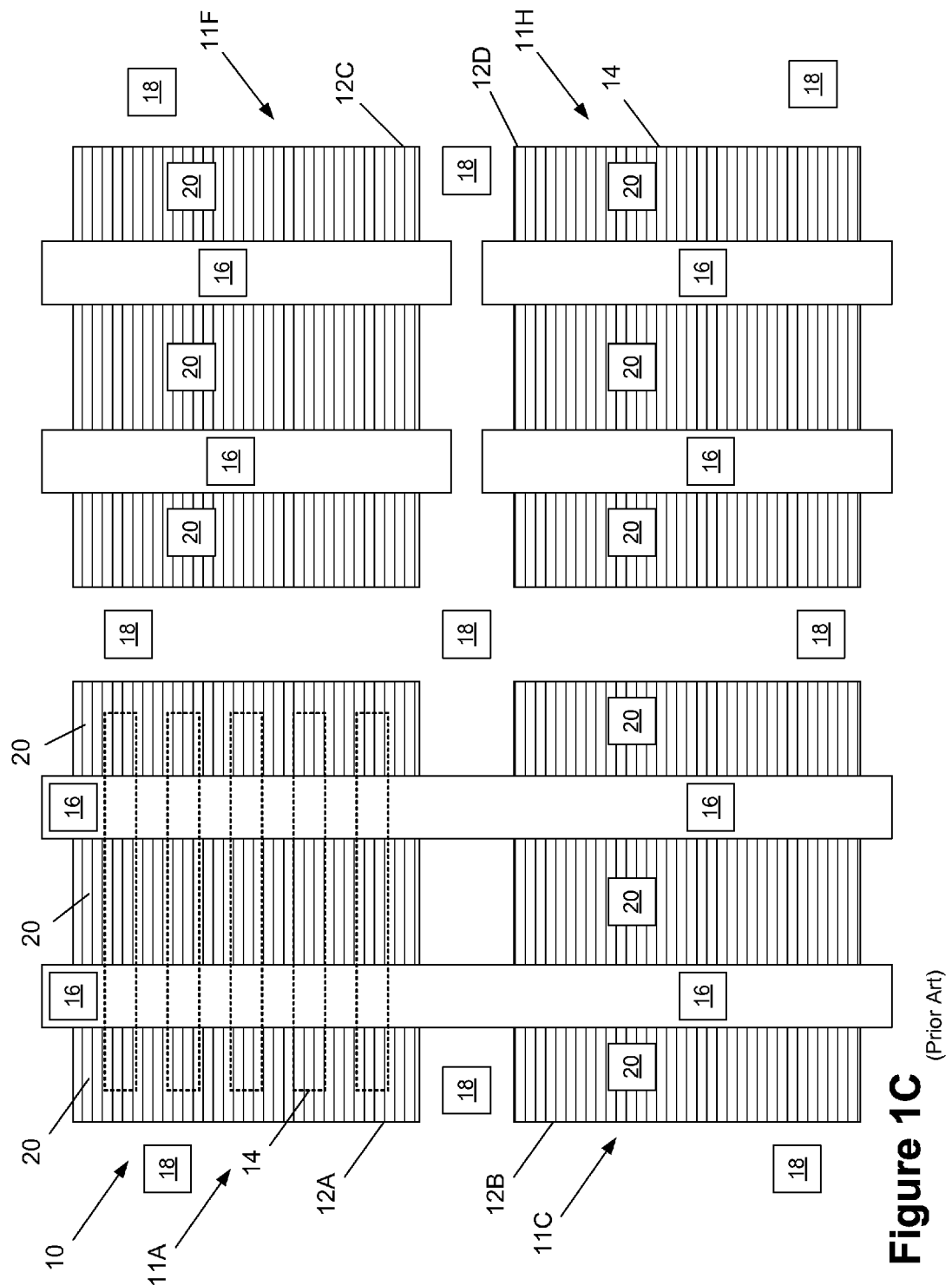
Figure 1D:
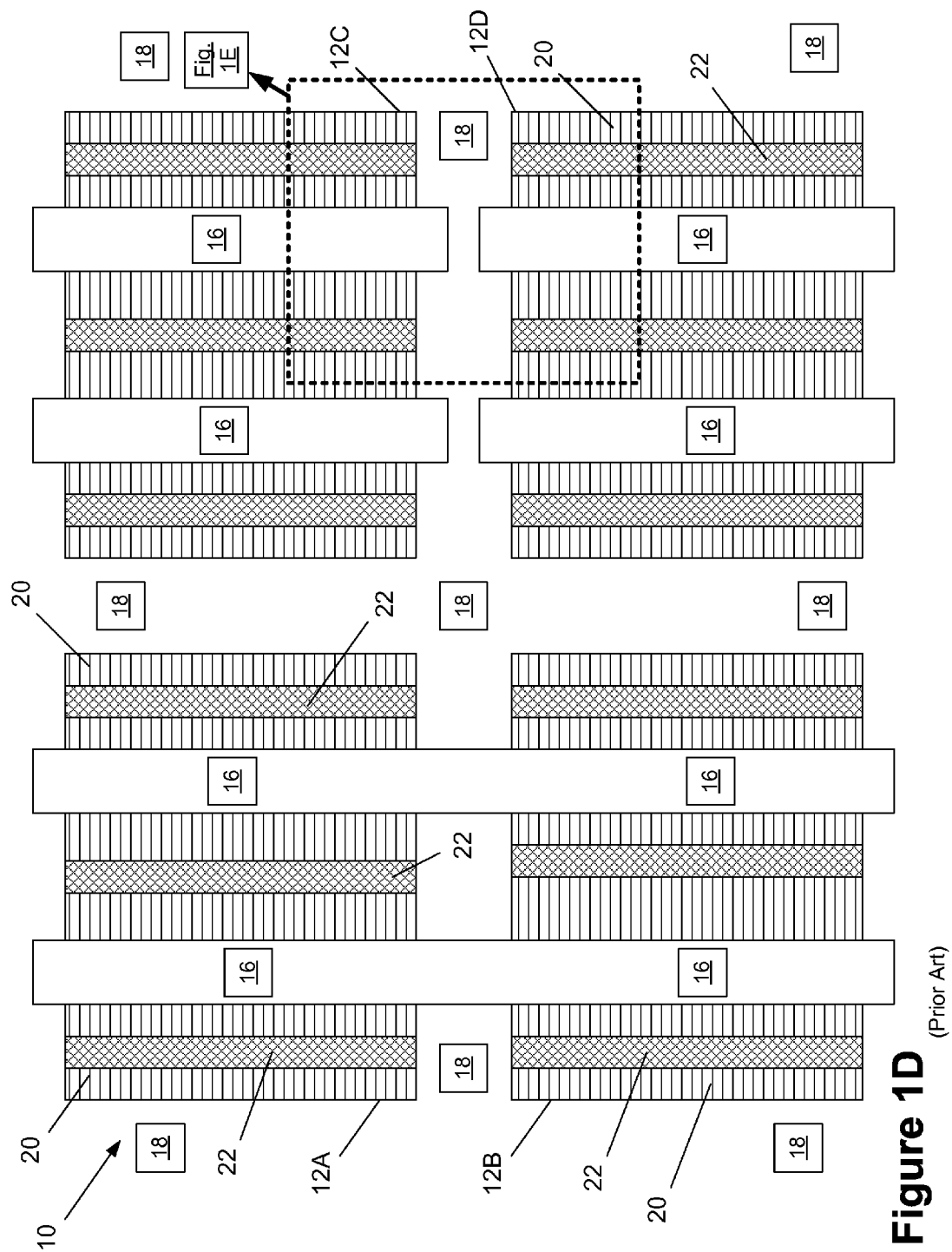
Figure 1E:
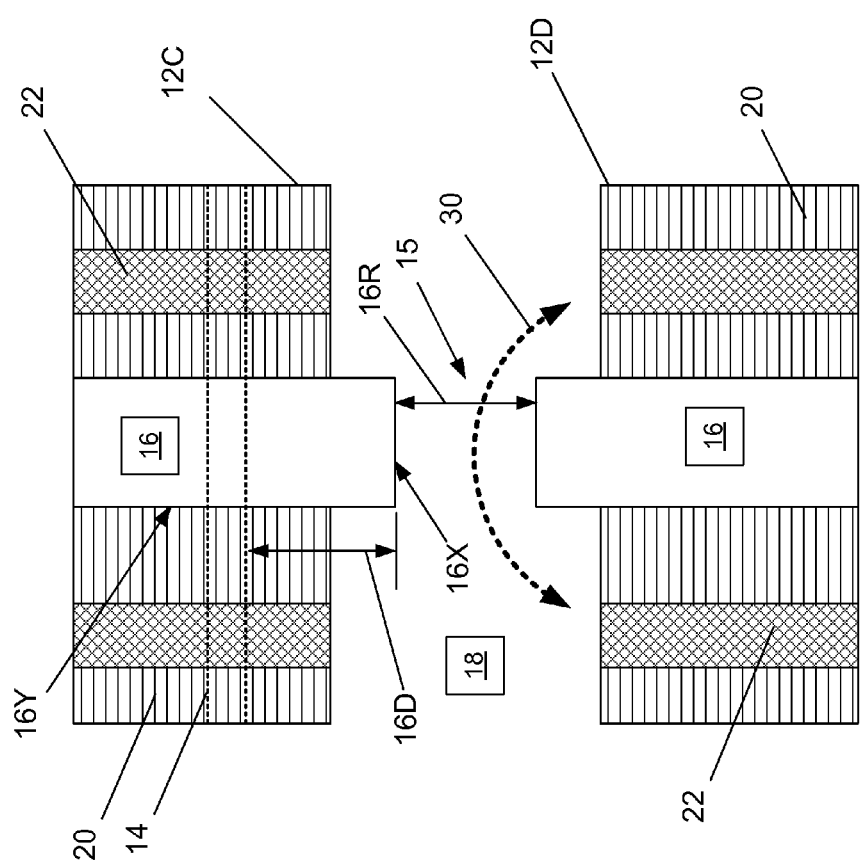

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming gate structures for FinFET devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

FIGS. 2A-2O depict various illustrative methods disclosed herein for forming gate structures for FinFET devices and the resulting devices. In general, the drawings contain a plan view and various cross-sectional views that are taken where indicated in the plan view. More specifically, the view "X-X" is taken along a line that passes through the fins 106, while the view "Y-Y" is a cross-section view that is taken transverse to the long axis of the fins 106. The illustrative FinFET devices that are depicted in the attached drawings may be either NMOS or PMOS devices. Additionally, various doped regions, e.g., source/drain regions, halo implant regions, well regions and the like, are also not depicted in the attached drawings. The illustrative integrated circuit product 100 depicted in the drawings is formed above an illustrative substrate 102 that may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Lastly, in the examples disclosed herein, the FinFET devices will be formed using a replacement gate technique, but the methods disclosed herein could also be employed when using so-called gate-first manufacturing techniques to form the gate structures of the FinFET device.

FIG. 2A depicts the product 100 at a point in fabrication wherein several process operations have been performed. First, a plurality of active regions 102A-D were defined in the substrate 102 by the formation of isolation structures 104. The isolation structures 104 may be formed using well-known techniques. The overall size of the active regions 102A-D may vary depending upon the particular application. Next, a plurality of trenches 105 were formed in the substrate 102 to thereby define a plurality of fins 106. The illustrative FinFET devices disclosed herein will be depicted as being comprised of five illustrative fins 106. However, as will be recognized by those skilled in the art after a complete reading of the present application, the methods and devices disclosed herein may be employed when manufacturing FinFET devices having any number of fins. In one embodiment, the trenches 105 were formed by performing an etching process through a patterned etch mask (not shown) e.g., a patterned hard mask layer, using known etching techniques. The patterned etch mask may be patterned using known sidewall image transfer techniques and/or photolithographic techniques, combined with performing known etching techniques. In some applications, a further etching process may be performed to reduce the width or to "thin" the fins 106, although such a thinning process is not depicted in the attached drawings. For purposes of this disclosure and the claims, the use of the terms "fin" or "fins" should be understood to refer to fins that have not been thinned as well as fins that have been subjected to such a thinning etch process. Thereafter, a layer of insulating material 108 was deposited on the substrate 102 so as to over-fill the trenches 105. Then, a recess etching process was performed on the layer of insulating material 108 such that the insulating material 108 only remains in the bottom of the trenches 105 so as to locally isolate the fins 106 from one another. This recess etching process exposes the fins 106 to their approximate desired final fin height.

With continuing reference to FIG. 2A, the overall size, shape and configuration of the trenches 105 and fins 106 may vary depending on the particular application. The depth and width of the trenches 105 may vary depending upon the particular application. In one illustrative embodiment, based on current day technology, the depth of the trenches 105 may range from approximately 40-100 nm and the width of the trenches 105 may be about 20-60 nm. In some embodiments, the fins 106 may have a final width (at or near the bottom of the fin) within the range of about 5-20 nm. In the illustrative examples depicted in the attached figures, the trenches 105 and fins 106 are all of a uniform size and shape. However, such uniformity in the size and shape of the trenches 105 and the fins 106 is not required to practice at least some aspects of the inventions disclosed herein. In the example depicted herein, the trenches 105 are formed by performing an anisotropic etching process that results in the trenches 105 having a schematically depicted, generally rectangular configuration. In an actual real-world device, the sidewalls of the trenches 105 may be somewhat inwardly tapered, although that configuration is not depicted in the drawings. In some cases, the trenches 105 may have a reentrant profile near the bottom of the trenches 105. To the extent the trenches 105 are formed by performing a wet etching process, the trenches 105 may tend to have a more rounded configuration or non-linear configuration as compared to the generally rectangular configuration of the trenches 105 that are formed by performing an anisotropic etching process. Thus, the size and configuration of the trenches 105 and the fins 106, and the manner in which they are made, should not be considered a limitation of the present invention. For ease of disclosure, only the substantially rectangular trenches 105 and fins 106 will be depicted in subsequent drawings.

FIG. 2B depicts the product after one or more gate structure materials have been formed above the fins 106. As noted previously, the final gate structures for the FinFET devices disclosed herein may be formed using either gate-first or gate-last techniques. For purposes of disclosing the present subject matter, the FinFET devices will be depicted as being formed using a gate-last or replacement gate technique. Accordingly, FIG. 2B depicts the product at a point of fabrication wherein the materials that will become a sacrificial gate structure 107 for the FinFET devices are formed above the substrate 102 and the fins 106. The underlying active regions and fins 106 are depicted in dashed lines in the plan view of FIG. 2B. In one illustrative embodiment, the sacrificial gate structure 107 is comprised of an illustrative sacrificial gate insulation layer 109 and an illustrative sacrificial gate electrode 110. The sacrificial gate insulation layer 109 may be comprised of a variety of different materials, such as, for example, silicon dioxide, etc. Similarly, the sacrificial gate electrode 110 may also be of a material such as polysilicon or amorphous silicon, etc. As will be recognized by those skilled in the art after a complete reading of the present application, the sacrificial gate structure 107 depicted in the drawings is intended to be representative in nature. That is, the sacrificial gate structure 107 may be comprised of a variety of different materials and it may have a variety of configurations. In one illustrative embodiment, an oxidation process may be performed to form a sacrificial gate insulation layer 109 comprised of a material such as, for example, silicon dioxide, etc., on the fins 106. Thereafter, material of the sacrificial gate electrode 110 and a gate capping layer of material (not shown) may be deposited above the layer of sacrificial gate electrode material. The layers of material depicted in FIG. 2B, as well as the layers of material described below, may be formed by any of a variety of different known techniques, e.g., a chemical vapor deposition (CVD) process, an atomic layer deposition (ALD) process, a thermal growth process, spin-coating techniques, etc.

FIG. 2C depicts the product 100 after at least portions of the layers that comprise the sacrificial gate structure 107 have been patterned to define an opening 112. The patterning of such layer(s) of material may be accomplished by performing one or more etching processes, e.g., dry or wet, through a patterned mask layer (not shown), e.g., a photoresist mask, that is formed above the sacrificial gate electrode 110. In some cases, such a patterned mask may be formed above a layer of gate cap material (not shown) that is formed above the material layer that corresponds to the sacrificial gate electrode 110. In the depicted example, the patterning process results in removing the sacrificial gate insulation layer 109 exposed by the opening 112. Using the methods disclosed herein, the ends 110X of the line-type sacrificial gate structures 107 are patterned first, via formation of the trench or opening 112, prior to patterning the side surfaces of what will become the relatively long, line-type gate electrode structures 107 from the gate stack material layer(s). That is, in contrast to the prior art method discussed in the background section of this application, a transverse "cut" 115 of the gate stack material layer(s) is first performed to define the ends 110X of what will become the sacrificial gate structures 107 of the FinFET devices. Stated another way, the patterning of the materials of the sacrificial gate structure 107 is performed in a sequence that establishes the overall axial length of the gate structure 107 (by patterning the ends 110X first) and thereafter performing a patterning process (discussed more fully below) to define the lateral width of the gate structures 107 (by performing a patterning operation that defines the side surfaces of the sacrificial gate structures 107.

FIG. 2D depicts the product 100 after a gate separation structure 114 was formed in the opening 112. The gate separation structure 114 may be comprised of a variety of materials, e.g., silicon dioxide, silicon nitride, etc. In one embodiment, the gate separation structure 114 may be formed by blanket-depositing a layer of insulating material, e.g., silicon dioxide, on the product 100 so as to over-fill the opening 112. Then, one or more planarization processes, e.g., CMP processes, may be performed to remove the excess portions of the gate separation material positioned above the surface 107S of the sacrificial gate structure 107 and outside of the opening 112. In some cases, if desired, the gate separation structure 114 may be recessed by performing an etch-back etching process and a cap layer may be formed above the recessed gate separation structure 114 using traditional manufacturing techniques, i.e., deposition of the cap material followed by performing a CMP process. In the depicted example, the ends 110X of what will become the sacrificial gate structures 107 abut the horizontal portions 114H of the gate separation structure 114. The horizontal portion 114H prevents several problems that may occur when an epi growth process is performed on the fins 106, e.g., it prevents a short circuit from forming around the ends of what will become the gate structure, it prevents short circuits that might form in the direction indicated by the line 115A between adjacent devices during the epi growth process, etc. The vertical portion 114V may be formed for a variety of reasons, e.g., to remove what would otherwise be "dummy" gate structures (not shown), to prevent short circuits that might form in the direction indicated by the line 115B between adjacent devices during epi growth processed performed on the fins 106, etc. Note that the upper surface 114S of the gate separation structure 114 may be positioned about 40-120 nm above the upper surface 106S of the fins 106.

FIG. 2E depicts the product 100 at an advanced state of fabrication. In addition to the cross-sectional views "X-X" and "Y-Y", additional cross-sectional views "A-A" and "B-B" are also shown in FIGS. 2E-2F. The "A-A" view is a cross-sectional view taken between the fins 106 across the active regions 102A and 102C. The "B-B" view is a cross-sectional view taken between the sacrificial gate structures 107 across the active regions 102C and 102D.

FIG. 2E depicts the product 100 after several process operations have been performed to pattern various layers of material so as to define the sacrificial gate structures 107. More specifically, a "gate patterning" process operation that involves performing one or more etching processes has been performed on the materials of the gate electrode structure 107 through a patterned mask layer 116 to arrive at the structure depicted in FIG. 2E. This etching process defines the side surfaces 110Y of the sacrificial gate electrodes 107. So as not to obscure the present invention, the patterned masking layer 116 has not been shown in the plan view of FIG. 2E. The patterning of such layer(s) of material may be accomplished by performing one or more etching processes, e.g., dry or wet, through the patterned mask layer 116, e.g., a photoresist mask, a hard mask, etc., that is formed above the sacrificial gate electrode material 110. This "gate patterning" process operation results in the formation of gate structures 107A (that span across the active regions 102A-102B) and the gate structures 107B, 107C (that span across the active regions 102C, 102D, respectively. As will be recognized by those skilled in the art, in this patterning step, the materials that will be used to define the sacrificial gate structures 107 for the product 100 are patterned to their desired lateral width that corresponds approximately to the channel length of the finished FinFET transistor devices.

FIG. 2F depicts the device 100 after several process operations were performed. First, sidewall spacers 122 were formed adjacent the structures depicted in FIG. 2E. The sidewall spacers 122 may be formed by depositing a layer of spacer material above the structures depicted in FIG. 2E, and thereafter performing an anisotropic etching process on the layer of spacer material so as to result in the spacers 122 depicted in the FIG. 2F. Thereafter, an epi semiconductor material 124, e.g., silicon, silicon/germanium, was formed on the exposed portions of the fins 106 positioned outside of the spacers 122. Note that, due to the presence of the gate separation structure 114 that contacts the end surfaces 110X of the gate structures 107B and 107C, epi semiconductor material 124 is prevented from forming around the ends 110X of the gate structures 107B/107C, thereby reducing or eliminating the chance for undesirable bridging between the source/drain regions of the FinFET devices shown in the drawings. In the depicted example, portions of the epi material 124 may contact the sidewall spacers 122 that are formed on both the gate structure, e.g., 107A, and the gate separation structure 114. Due to the presence of the vertical portion 114V of the gate separation structure 114, the epi semiconductor material 124 is prevented from bridging the distance between the source/drain regions of the devices 102A, 102C (see view A-A).

The next series of process operations involves formation of a replacement gate structure of the devices. FIG. 2G depicts the product 100 after a layer of insulating material 130, e.g., silicon dioxide, has been blanket-deposited above the epi semiconductor material 124 and after a planarization process was performed to planarize the upper surface of the layer of insulating material with the upper surface of the patterned mask layer 116 (or gate cap layer if present).

FIG. 2H depicts the device 100 after several process operations were performed. First, an etching process was performed to remove the patterned mask layer 116 (gate cap layer if present) so as to thereby expose the sacrificial gate electrode 110. Then, one or more etching processes were performed to remove the exposed sacrificial gate electrode 110 and the sacrificial gate insulation layer 109 so as to define a gate cavity 132 where the final gate structure (the "replacement gate" of the device) will be formed. Typically, the sacrificial gate insulation layer 109 is removed as part of the replacement gate technique so as to expose the upper surface 106S of the fins 106 within the gate cavities 132, as depicted herein. However, the sacrificial gate insulation layer 109 may not be removed in all applications. Even in cases where the sacrificial gate insulation layer 109 is intentionally removed, there will typically be a very thin native oxide layer (not shown) that forms on the fins 106 within the gate cavity 132.

FIG. 2I depicts the product 100 after a schematically depicted replacement gate structure "R" and a gate cap layer 134 have been formed in the gate cavities 132. The replacement gate structure is intended to be representative in nature of any type of gate structure that may be employed in manufacturing integrated circuit products using so-called gate-last (replacement gate) manufacturing techniques. Such a replacement gate structure typically comprises a high-k (k value greater than 10) gate insulation layer (not individually shown), such as hafnium oxide, one or more metal layers (not individually shown) (e.g., layers of titanium nitride or TiAlC, depending upon the type of transistor device being manufactured), and a bulk conductive material layer (not individually shown), such as tungsten or aluminum. After the materials of the replacement gate structure are formed in the gate cavity 132, a CMP process is typically performed to remove the excess materials positioned outside of the gate cavity 132. Thereafter, one or more dry or wet etching processes may be performed to remove portions of the materials of the replacement gate structure and thereby define a recess within the upper portion of the gate cavity 132. The gate cap layer 134 may then be formed in each of the recesses. The gate cap layer 134 may be comprised of a variety of materials, e.g., silicon nitride, etc. In one embodiment, the cap layers 134 may be formed by blanket-depositing a cap layer material, e.g., silicon nitride, on the product 100 so as to over-fill the recess in the gate cavities 132 above the replacement gate structures and thereafter performing a planarization process, e.g., CMP processes, to remove the portions of the cap layer material positioned above the surface of the layer of insulating material 130 and outside of the gate cavities 132.

Figure 2M:
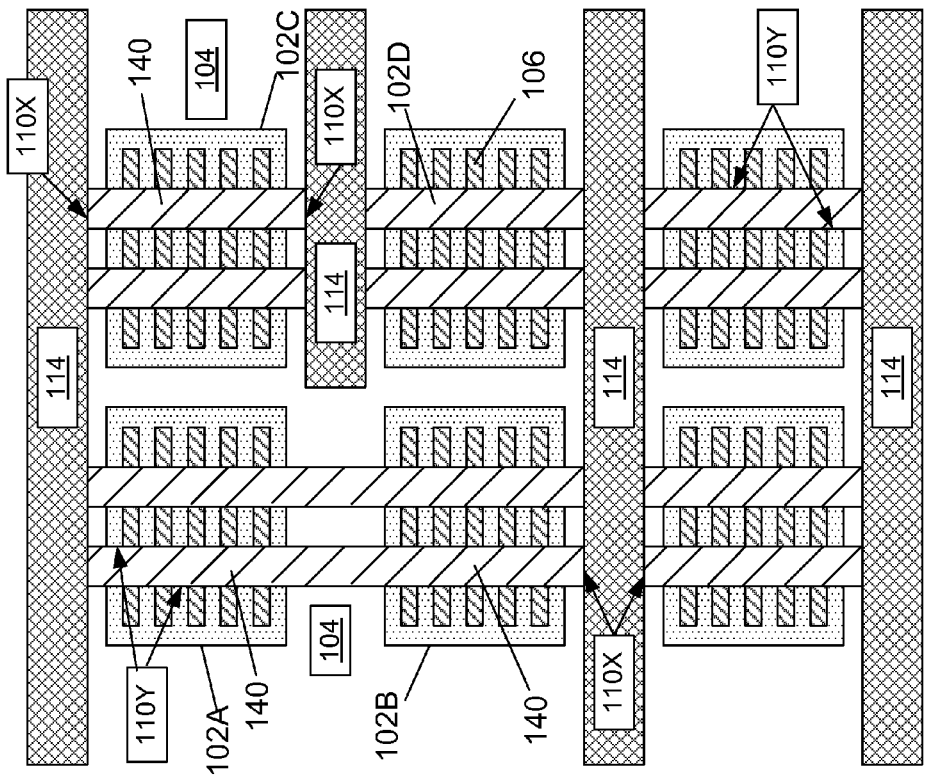
FIGS. 2A-2O depict various illustrative methods disclosed herein for forming gate structures for FinFET devices, and the resulting devices.

As will be appreciated and understood by those skilled in the art after a complete reading of the present application, there are several novel methods and devices disclosed herein. FIG. 2J-2M depict one illustrative example where the methods disclosed herein may be employed to manufacture integrated circuit products. FIG. 2J depicts a product 100 comprised of six illustrative spaced-apart active regions 102A-F. The active regions are defined by the above-described isolation structure 104. FIG. 2J depicts the desired configuration of the gate structures 140 (which may be final gate structures or sacrificial gate structures) for the finished integrated circuit product. FIG. 2J depicts the device at a point in fabrication wherein the fins 106 and the local isolation material 108 have been formed. Note that, in this example, the active regions 102A, 102B share a common gate structure 140, while all of the other gate structures span only a single active region.

Figure 2L:
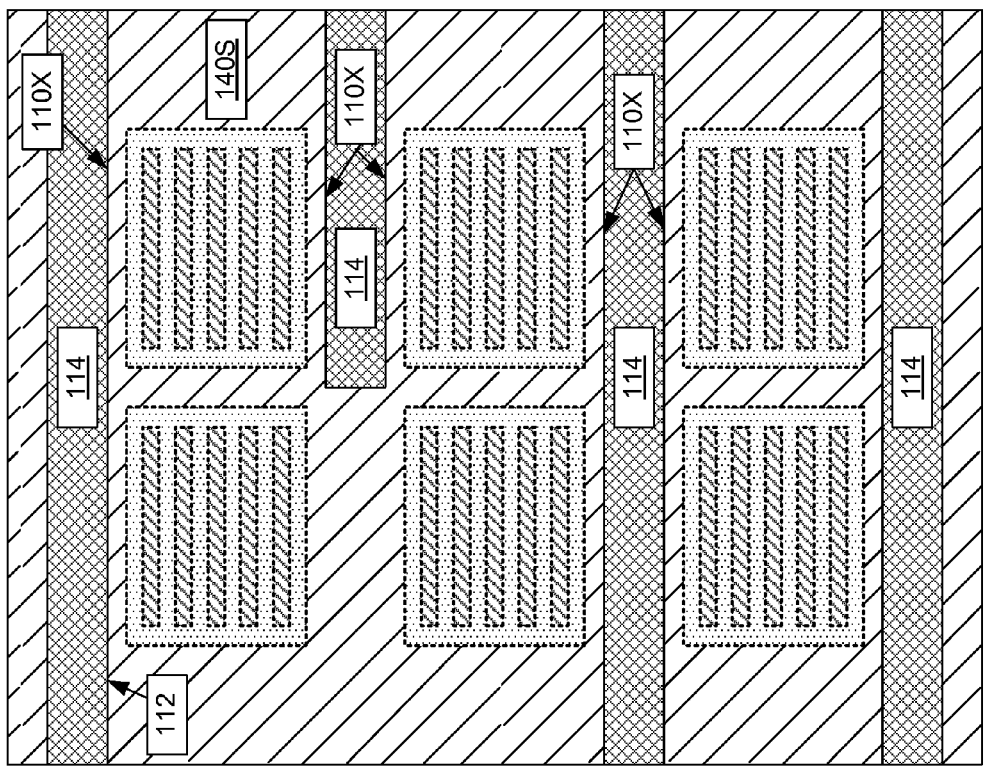

FIG. 2K depicts the beginning of one illustrative sequence disclosed herein for forming the gate structures 140 shown in FIG. 2J. The active regions and the fins 106 are depicted in dashed lines in FIGS. 2K-2N. Initially, the stack of materials 140S that will comprise the gate structure 140 (be it a final gate structure or a sacrificial gate structure) are blanket-deposited across all of the active regions. FIG. 2L depicts the product after several process operations were performed. First, one or more etching processes were performed to form a plurality of the above-described openings or trenches 112 through the stack of materials 140S. The formation of the trenches 112 defines what will become the end surfaces 110X of the gate structures 140. In this particular example, trenches 112 are spaced-apart trenches, i.e., two of the spaced-apart trenches 112 are required to define the overall axial length of the final gate structures 140. Note that, due to the fact that the active regions 102A, 102B will share a common gate electrode 140, a trench 112 is not present between the active regions 102A, 102B. FIG. 2L also depicts the product 100 after the above-described gate separation structure 114 was formed in the spaced apart trenches 112. FIG. 2M depicts the product after another etching process was performed on the stack of materials 140S through a patterned mask layer (not shown) to define the side surfaces 110Y of the gate structures 140.

FIGS. 2N-2P depict the beginning of another illustrative sequence disclosed herein for forming the gate structures 140 shown in FIG. 2J. Initially, the stack of materials 140S that will comprise the gate structure 140 (be it a final gate structure or a sacrificial gate structure) are blanket-deposited across all of the active regions, as depicted in FIG. 2K. Then, as shown in FIG. 2N, a continuous trench 112 was formed in the stack of materials 140S by performing an etching process through a patterned etch mask (not shown). The formation of the continuous trench 112 defines what will become the end surfaces 110X of the gate structures 140. In this particular example, since the trench 112 is continuous in nature, only a single trench 112 needs to be formed to define the overall axial length of the gate structures 140. Note that, due to the fact that the active regions 102A, 102B will share a common gate electrode 140, a portion of the trench 112 is not present between the active regions 102A, 102B. FIG. 2N also depicts the product 100 after the above-described gate separation structure 114 was formed in the continuous trench/opening 112. FIG. 2O depicts the product after another etching process was performed on the stack of materials 140S through a patterned mask layer (not shown) to define the side surfaces 110Y of the gate structures 140. As noted above, due to the presence of the gate separation structure 114, undesirable epi bridging is prevented between the ends 110X of the electrodes 140, as well as between the epi material on adjacent devices (e.g., 102A and 102C).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a plurality of gate structures, the method comprising:
    forming a gate structure material layer stack above a semiconductor substrate;
    performing at least one first etching process on said gate structure material layer stack through a first patterned etch mask to form at least one first opening through said gate structure material layer stack, wherein said at least one first opening exposes an end surface of said plurality of gate structures;
    removing said first patterned etch mask;
    forming a gate separation structure in said at least one first opening; and
    with said gate separation structure in position in said at least one first opening, performing at least one second etching process on said gate structure material layer stack through a second patterned etch mask to form a plurality of second openings through said gate structure material layer stack, wherein said plurality of second openings expose side surfaces of said plurality of gate structures.

2. The method of claim 1, wherein said at least one first opening is comprised of a plurality of spaced-apart first openings and wherein said gate separation structure is formed in each of said plurality of spaced-apart first openings.

3. The method of claim 1, wherein said at least one first opening is a continuous opening and wherein said gate separation structure is formed in said continuous opening.

4. The method of claim 1, wherein said plurality of gate structures are sacrificial gate structures.

5. The method of claim 1, wherein said plurality of gate structures are final gate structures.

6. The method of claim 1, wherein said gate separation structure is formed such that it abuts said end surfaces.

7. The method of claim 1, wherein said gate separation structure is formed such that its upper surface is substantially planar with an upper surface of said gate structure material layer stack.

8. The method of claim 1, further comprising, after performing said at least one second etching process and with said gate separation structure in position in said at least one first opening, performing an epitaxial deposition process to form an epitaxial semiconductor material above said substrate.

9. The method of claim 1, wherein at least one fin is formed above each of a plurality of spaced-apart active regions defined in said semiconductor substrate and wherein the method comprises forming said gate structure material layer stack above said at least one fin in each of said active regions.

10. The method of claim 8, wherein said epitaxial semiconductor material abuts a sidewall spacer formed on said gate separation structure.

11. A method of forming a plurality of gate structures, the method comprising:
- forming a gate structure material layer stack above a plurality of spaced-apart active regions defined in a semiconductor substrate, each of said plurality of spaced-apart active regions having at least one fin formed thereabove;
- performing at least one first etching process on said gate structure material layer stack through a first patterned etch mask to form at least one first opening through said gate structure material layer stack, wherein said at least one first opening exposes an end surface of said plurality of gate structures;
- removing said first patterned etch mask;
- forming a gate separation structure in said at least one first opening, wherein said gate separation structure is formed such that it abuts said end surfaces; and
- with said gate separation structure in position in said at least one first opening, performing at least one second etching process on said gate structure material layer stack through a second patterned etch mask to form a plurality of second openings through said gate structure material layer stack, wherein said plurality of second openings expose side surfaces of said plurality of gate structures.

12. The method of claim 11, wherein said at least one first opening is comprised of a plurality of spaced-apart first openings and wherein said gate separation structure is formed in each of said plurality of spaced-apart first openings.

13. The method of claim 11, wherein said at least one first opening is a continuous opening and wherein said gate separation structure is formed in said continuous opening.

14. The method of claim 11, wherein said gate separation structure is formed such that its upper surface is substantially planar with an upper surface of said stack of material layers.

15. The method of claim 11, further comprising, after performing said at least one second etching process, and with said gate separation structure in position in said at least one first opening, performing an epitaxial deposition process to form an epitaxial semiconductor material on said at least one fin in each of said plurality of spaced-apart active regions.

16. The method of claim 1, wherein forming said at least one first opening through said gate structure material layer stack comprises defining a first gate structure region above a first active region formed in said semiconductor substrate and defining a second gate structure region above a second active region formed in said semiconductor substrate, said first gate structure region comprising a first portion of said gate structure material layer stack and having a first end surface and said second gate structure region comprising a second portion of said gate structure material layer stack and having a second end surface that is laterally opposed to and facing said first end surface of said first gate structure region.

17. The method of claim 16, wherein forming said plurality of second openings through said gate structure material layer stack comprises defining a plurality of first spaced-apart gate structures above said first active region from said first gate structure region and defining a plurality of second spaced-apart gate structures above said second active region from said second gate structure region.

18. The method of claim 1, wherein said gate structure material layer stack comprises a layer of gate insulation material and a layer of gate electrode material formed above said layer of gate insulation material.

19. A method of forming a plurality of first and second gate structures, the method comprising:
- forming a gate structure material layer stack above first and second spaced-apart active regions defined in a semiconductor substrate;
- forming a first opening through said gate structure material layer stack to define first and second spaced-apart gate structure regions, said first opening exposing a first end surface of said first gate structure region and exposing a second end surface of said second gate structure region, wherein said first end surface is laterally opposed to and facing said second end surface;
- forming a gate separation structure in said first opening, said gate separation structure directly contacting said first and second end surfaces and electrically isolating said first gate structure region from said second gate structure region; and
- with said gate separation structure positioned in said first opening, forming a first plurality of second openings through said first gate structure region so as to define a plurality of first gate structures above said first active region and forming a second plurality of second openings through said second gate structure region so as to define a plurality of second gate structures above said second active region, said first and second pluralities of second openings exposing side surfaces of said respective pluralities of first and second gate structures.

20. The method of claim 19, further comprising, prior to forming said gate structure material layer stack, forming a plurality of first spaced-apart fins above said first active region and forming a plurality of second spaced-apart fins above said second active region, said gate structure material layer stack being formed on said pluralities of first and second spaced apart fins.

* * * * *